United States Patent [19]
Shigeta et al.

[11] Patent Number: 6,052,518
[45] Date of Patent: Apr. 18, 2000

[54] LOGICAL CIRCUIT AUTOMATICAL DESIGN METHOD AND SYSTEM, AND COMPUTER READABLE MEDIUM FOR STORING A PROGRAM FOR PERFORMING AUTOMATICALLY DESIGNING PROCESS THEREIN

[75] Inventors: Yoshinori Shigeta; Masatoshi Sekine, both of Tokyo; Hiroaki Nishi, Tokoy; Atsushi Masuda; Takanao Amatsubo, both of Tokyo, all of Japan

[73] Assignee: Kabushiki Kaisha Toshiba, Kawasaki, Japan

[21] Appl. No.: 09/069,864

[22] Filed: Apr. 30, 1998

[30] Foreign Application Priority Data

May 9, 1997 [JP] Japan .................................. 9-119934
Jun. 4, 1997 [JP] Japan .................................. 9-146661

[51] Int. Cl.$^7$ ...................................................... G06F 17/50
[52] U.S. Cl. ...................................................... 395/500.19
[58] Field of Search .................................. 364/488, 489, 364/490, 491; 395/500.02, 500.19

[56] References Cited

U.S. PATENT DOCUMENTS

| | | | |
|---|---|---|---|
| 5,418,953 | 5/1995 | Hunt et al. ................................. | 395/650 |
| 5,808,917 | 9/1998 | Chatterjee et al. ........................ | 364/578 |
| 5,867,400 | 2/1999 | El-Ghoroury et al. ............ | 395/500.02 |
| 5,870,588 | 2/1999 | Rompaey et al. .......................... | 395/500 |
| 5,896,521 | 4/1999 | Shackleford et al .................... | 395/500 |

OTHER PUBLICATIONS

DeMan et al. "Architecture–Driven Synthesis Techniques for VLSI Implementation of DSP Algorithms," Proceedings of the IEEE, vol. 78, No. 2, Feb. 1990, pp. 319–335.

Shirai and Hiwatashi "A Design System for Special Purpose Processors Based on Architectures for Distributed Processing," 1995 IEEE.

Takezawa and Shirai "Interactive Design Environment of VLSI Architecture for Digital Signal Processing," 1990 International Conference on Acoustics, Speech and Signal Processing, Apr. 3–6 1990, pp. 1085–1088, vol. 2.

Masuda et al., "Search Space Reduction In High Level Synthesis By Use Of An Initial Circuit", *Proc. of ASP–DAC,* pp. 1–7, (1995).

Ikenaga et al., "Special Purpose Processor Design System Realizing Algorithm Described By Higher Level Language", vol. 32(11):1445–14456, (1991).

Hiwatashi et al., "Evaluation Of Hardware–Oriented And Software–Oriented Approach In Design System For Special Purpose Processors", pp. 6–101–102, (1994).

*Primary Examiner*—Paul R. Lintz
*Assistant Examiner*—Leigh Marie Garbowski
*Attorney, Agent, or Firm*—Foley & Lardner

[57] ABSTRACT

A model of architecture of a processor is called an architecture template. Because a designer selects an architecture template of a special purpose processor which is suitable for an objective signal processing algorithm from an architecture template library, a special purpose processor which is the most suitable for any signal algorithm can be synthesized. Moreover, by providing a method of creating an architecture template simply, even if there is no desirable architecture template, an objective architecture template can be synthesized for a short time.

10 Claims, 15 Drawing Sheets

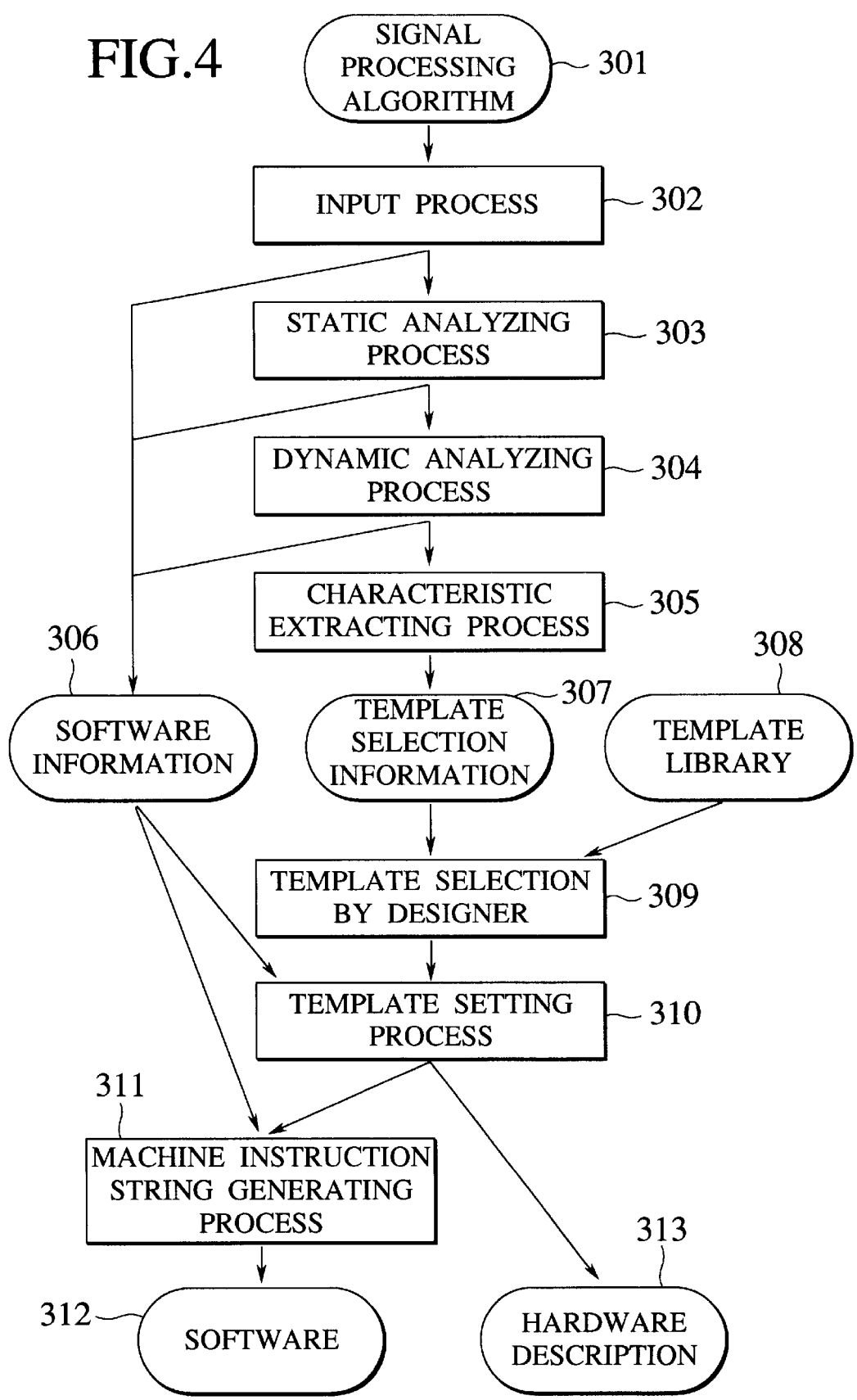

FIG.5

```
01:#define  ADD     1
02:#define  LOAD    2
03:#define  STORE   3
04:#define  JUMP    4

05:input     int  iport [1];
06:output    int  oport [1];
07:register  int  pc;
08:register  int  data;
09:register  int  regfile[128];
10:rom       int  prg [1024];
11:ram       int  mem[1024];

12:void main(void)
13:{
14:    int inst, op, f1, f2, f3;

15:    data = iport [ 0 ];
16:    inst = prg[pc];
17:    op = (inst >> 24) & 0xff;
18:    switch (op) {
19:    case ADD:
20:         f1 = (inst >> 16) & 0xff;
21:         f2 = (inst >> 8)  & 0xff;
22:         f3 =  inst        & 0xff;
23:         regfile[f3] = regfile[f1] + regfile[f2];
24:         break;
25:    case LOAD:
26:         f1 = (inst >> 16) & 0xff;
27:         f2 = (inst >> 8)  & 0xff;
28:         regfile[f1] = mem[f2];
29:         break;
30:    case STORE:
31:         f1 = (inst >> 16) & 0xff;
32:         f2 = (inst >> 8)  & 0xff;
33:         mem[f1] = regfile[f2];
34:         break;
35:    case JUMP:
36:         f1 = intst & 0xffff;
37:         pc = f1;
38:         break;
39:    }
40:    oport[0] = data ;
41: }
```

FIG.14

```
/* HIGHER-LEVEL SYNTHESIZING CONDITIONS
   WORK MODEL         :simple.c
   INITIAL CIRCUIT    :simple.ict
   SEARCH PARAMETER   :1000
   CLOCK              :25
*/
input    int iport [1];   /* INPUT PORT DECLARATION */
output   int oport[1];    /* OUTPUT PORT DECLARATION */
register int pc;          /* REGISTER DECLARATION */
register int data;        /* REGISTER DECLARATION */
register int regfile[ ];  /* REGISTER FILE DECLARATION */
rom      int prg[ ];      /* ROM DECLARATION */
ram      int mem[ ];      /* RAM DECLARATION */

/* ALU DECLARATION */
ALU {
  ADD: a1 : a2 : a3 {
    R(int , regfile , A( a3 )) =
        R(int , regfile , A( a1 ) + R( int ; regfile , A( a2 )) ;
  }
  LOAD: a1 : a2 {
    R(int , regfile , A( a1 )) + M( int, mem , A( a2 )) ;
  }
  STORE: a1 : a2 {
    M( int, mem , A( a1 )) = R(int , regfile , A( a2 )) ;
  }
  JUMP; a1 {
    GOTO A( a1) ;
  }
}
```

```
library std;
use std. standard. all;

entity VERY_SIMPLE_CPU is
  port(
    EW_CLOCK : in BIT;
    HW_RESET : in BIT;
    I PORT    : in TYPE(TYPE STRING);
    OPORT     : out TYPE (TYPE STRING);
  );
end VERY_SIMPLE_CPU;

architecture structual of VERY_SIMPLE_CPU is
    :
    :
  signal T020 : _CDS_TYPET;
  signal T021 : _CDS_TYPE(TYPE STRING);
USE_ADD
  signal T027 : _CDS_TYPE(TYPE STRING);
  signal T029 : _CDS_TYPE(TYPE STRING);
  signal T028 : _CDS_TYPE(TYPE STRING);
END
    :
    :
  OPORT(1) <= CONST(TYPE STRING,0);
  OPORT(2) <= CONST(TYPE STRING,0);
   T021 <= CONST(TYPE STRING,0);
USE_ADD
   T029 <= CONST(TYPE STRING,0);
   T028 <= CONST(TYPE STRING,0);
END
   T026 <= CONST(TYPE STRING,0);
   T016 <= CONST(TYPE STRING,0);
    :
    :
end structual;
```

LOGICAL CIRCUIT AUTOMATICAL DESIGN METHOD AND SYSTEM, AND COMPUTER READABLE MEDIUM FOR STORING A PROGRAM FOR PERFORMING AUTOMATICALLY DESIGNING PROCESS THEREIN

BACKGROUND OF THE INVENTION

1. Field of the Invention

The present invention relates to a field of the art relating to automatic design of a logical circuit, more specifically, the present invention is used for synthesizing an architecture template of a special purpose processor.

2. Prior Art

One of Design Systems for Special Purpose Processors is SYARDS ("Special Purpose Processor Design System Realizing Algorithm Described by Higher Level Language" by Ikenaga and Shirai, in Thesis of Information Processing Society of Japan, Vol. 32, No.11, pp. 1445–1456, 1991) ("Evaluation of Hardware-oriented and Software-oriented Approach in Design System for Special Purpose Processors (SYARDS) by Hiwatashi and Shirai, in 49th National Convention of Information Processing Society of Japan, Collected theses, 4L-8, pp. 6–101–102, 1994). In SYARDS, when a signal processing algorithm and sample data are inputted, hardware description of the special purpose processor optimized for the signal processing algorithm and sample data, and a binary code of the signal processing algorithm operated in the special purpose processor are synthesized.

However, SYARDS has a problem such that architecture of an assumed processor is fixed. There arises no problem in the case of a signal processing algorithm which is adapted to the fixed processor architecture, but not in that case, an optimal special purpose processor can not be necessarily synthesized. There are various signal processing algorithms, and an adaptable scope of fixed processor architecture is not very wide.

SUMMARY OF THE INVENTION

The present invention is revised in view of the aforementioned conditions, and it is an object of the present invention to provide a method of selecting architecture of a special purpose processor and a method of simply synthesizing a model of architecture of the processor.

In order to achieve the above object, there is provided a logical circuit automatic design system for automatically synthesizing a special purpose processor which is optimized to perform a necessary signal processing algorithm, the system comprising: storage means for storing plural architecture templates of a processor; output means for outputting at least one plural architecture template of a processor suitable for the necessary signal processing algorithm; input means for selecting one of at least one architecture template outputted by the output means; and synthesizing means for automatically synthesizing the special purpose processor which is optimized to perform the necessary signal processing algorithm.

In order to achieve the above object, there is provided an architecture template automatically generating system for automatically generating an architecture template from a operation model, the system comprising: DFG (Data Flow Graph) generating means for generating DFG from the operation model; scheduling processing means for determining an execution time of each operation node of the DFG so as to generate scheduling information; allocation processing means for generating hardware information from the scheduling information; and architecture template generation processing means for generating an architecture template from the hardware information.

In a preferred embodiment of the present invention, as or the operation mode, an integer type, floating-point type, input port type, output port type, register type, RAM type and ROM type can be specified as data type.

In a preferred embodiment of the present invention, the template generation processing means comprises: program counter inference processing means for inferring a program counter of the processor in the operation model; decode section inference processing means for inferring a decode section; instruction code constitution inference processing means for inferring a constitution of an instruction code; and template output processing means for outputting the architecture template.

In a preferred embodiment of the present invention, the architecture template includes an input port declaration section, output port declaration section, register declaration section, register file declaration section, RAM declaration section, ROM declaration section, ALU declaration section and HW declaration section.

In a preferred embodiment of the present invention, the architecture template includes HW declaration of the processor in which a bit width of the integer type, a bit width of the floating point type, a bit width of fraction of the floating point type, a bit width of characteristic of the floating point type, bit width of the input port, bit type of the output port, bit width of the register, bit width of the RAM, bit width of the ROM, bit width of processor instruction, bit width of an instruction operation code section, bit width of an instruction register specifying section, bit width of an instruction I/O port specifying section, bit width of an instruction RAM address specifying section, bit width of an instruction immediate, the number of words in the RAM, the number of words in the ROM, the number of the I/O ports, the number of the output ports and unnecessary instruction are parameterized.

In the present invention, a model of architecture of a processor is called an architecture template. Because a designer selects an architecture template of a special purpose processor suitable for an objective signal processing algorithm from an architecture library, a special purpose processor which is the most suitable for any signal algorithm can be synthesized. Moreover, by providing a method of simply creating an architecture template, even if there is no desirable architecture template, an objective architecture template can be synthesized for a short time.

In the present invention, an architecture template of a special purpose processor is automatically synthesized from a operation mode of the special purpose processor by utilizing a part of the higher level synthesizing technique (A. Masuda, H. Imai, J. P. Hansen, M. Sekine: "Search Space reduction in High level Synthesis by Use of an Initial Circuit", Proc. of ASP-DAC'95, pp.471–477, 1995). The operation model includes description only about work of instruction set level of the special purpose processor and does not include description about a structure and control of the processor. For this reason, the designer can create a new architecture template easily, so even if there is no desirable architecture template, the designer can obtain a new architecture template for a short time.

In order to achieve the above object, there is provided a logical circuit automatically designing method of automatically synthesizing a special purpose processor which is optimized to perform a necessary signal processing algorithm, the method comprising the steps of: generating plural architecture templates; storing the plural architecture templates into storage means; outputting at least one architecture template of a processor which is suitable for the necessary signal processing algorithm from the plural architecture templates; selecting one from at least one architecture templates; and automatically synthesizing a special purpose processor which is optimized to perform the necessary signal processing algorithm using the selected architecture template.

In order to achieve the above object, there is provided an architecture template automatically generating method of automatically generating, an architecture template from a operation model, the method comprising the steps of: generating Data Flow Graph (DFG) from a operation model; determining an execution time of each operation node of the DFG so as to generate scheduling information; generating hardware information from the scheduling information; and generating an architecture template from the hardware information.

In order to achieve the above object, there is provided a computer readable medium for storing a program for executing a logical circuit automatically designing process for automatically generating an architecture template from a operation model, the program comprising: a DFG (Data Flow Graph) generating process for generating DFG from the operation model; a scheduling process for determining an execution time of each operation node of the DFG so as to generate scheduling information; an allocation process for generating hardware information from the scheduling information; and an architecture template generating process for generating an architecture template from the hardware information.

The nature, principle and utility of the invention will become more apparent from the following detailed description when read in conjunction with the accompanying drawings.

BRIEF DESCRIPTION OF THE DRAWINGS

In the accompanying drawings:

FIG. 4 is a design flow in the case where a special purpose processor is designed by selecting the architecture template according to the present invention;

FIG. 5 is a drawing showing an example of the operation model;

FIG. 14 is a drawing showing a high-level synthesizing condition, input port declaration, output port declaration, register declaration, register file declaration, ROM declaration, RAM declaration and ALU declaration; and FIG. 15 is a drawing showing a portion of HW declaration generated from the operation model.

DETAILED DESCRIPTION OF THE PREFERRED EMBODIMENTS

The following describes embodiments of the present invention in detail on reference to the drawings.

Figure 1:
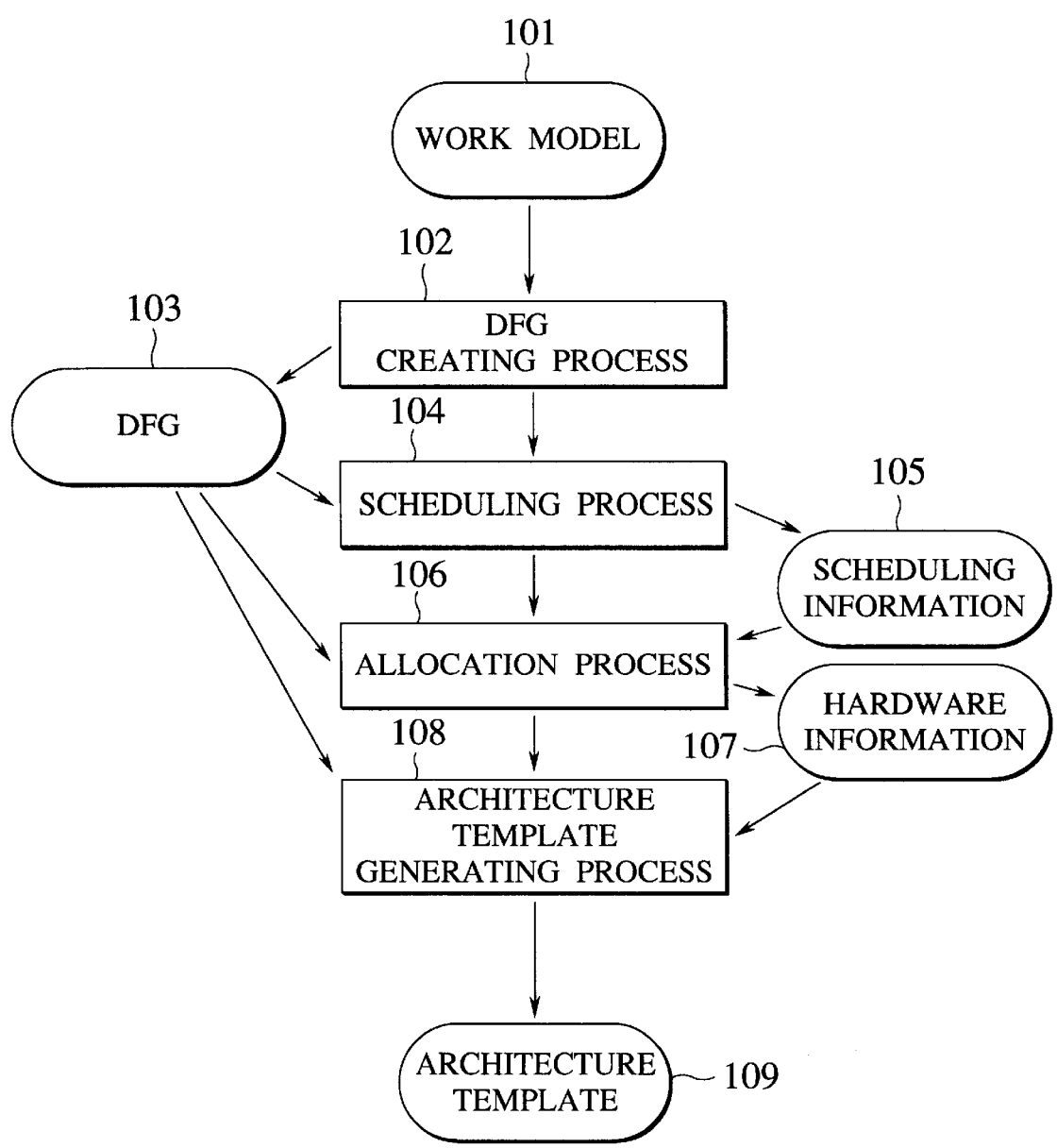
FIG. 1 is a flow chart showing a whole operation of a process of synthesizing an architecture template from a operation model according to the present invention.

First, referring to FIG. 1, the description is given as to a flow of the whole operation for synthesizing the architecture template in an embodiment of the present invention. First, in a DGF creating process 102, from an operation model 101 in which a work of a processor is described, a DFG 103 is created, in which operation described in the operation model 101 is used as a node and a flow of data between the operation is used as an edge. Then, a scheduling process 104 determines an execution time for each node of the DFG 103 in view of dependency of data and creates scheduling information 105. Next, an allocation process 106 creates hardware information 107 based on the DFG 103 and scheduling information 105. Further, an architecture template generating process 108 creates an architecture template 109 based on the DFG 103 and hardware information 107.

Figure 2:
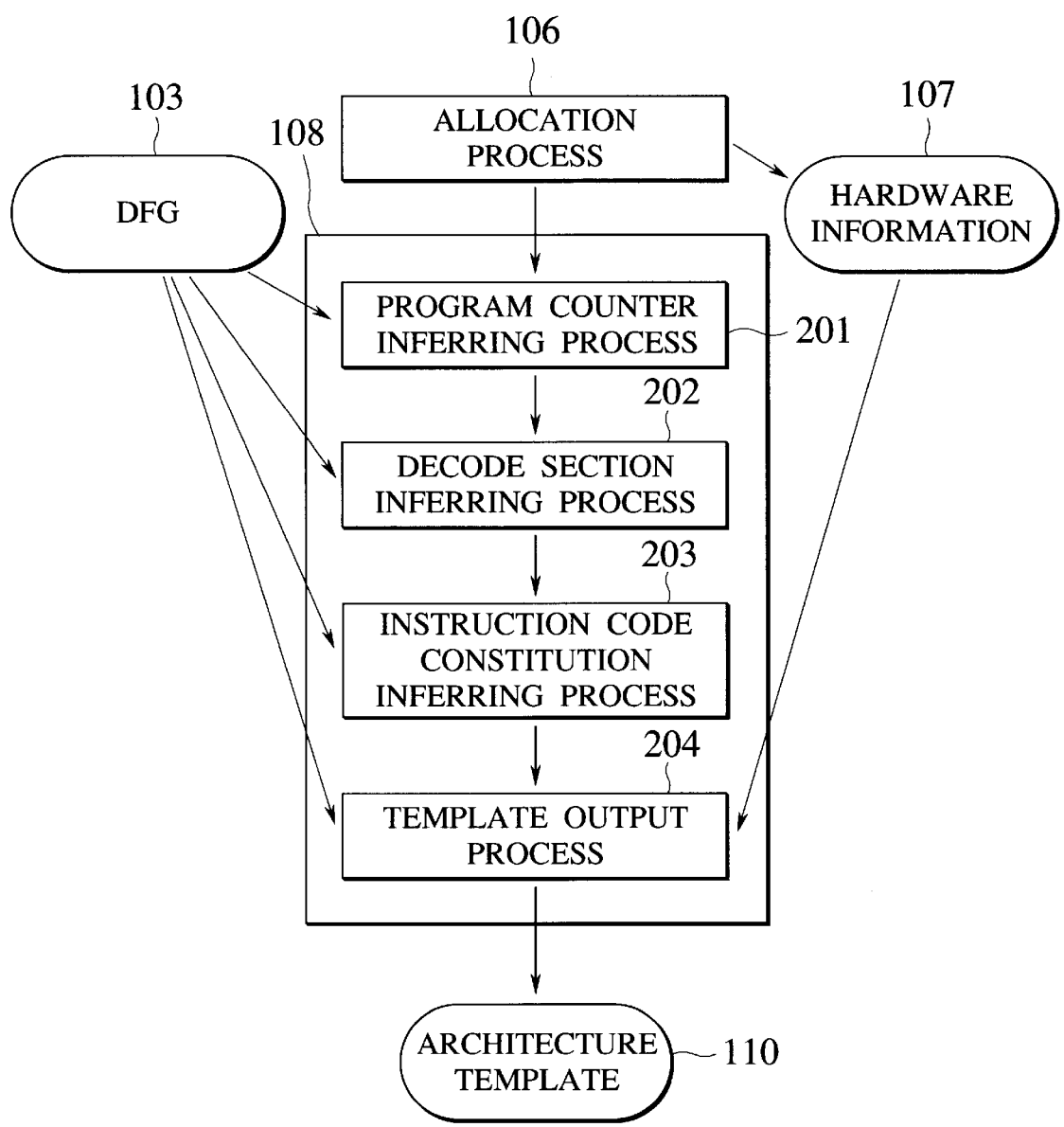
FIG. 2 is a flow chart showing an operation of a process of generating the architecture template according to the present invention.

Referring to FIG. 2, the detailed description is give as to the architecture template generating process 108 in the embodiment of the present invention. First, a program counter inferring process 201 analyzes the DFG 103 to infer variables which are used as program counter of the processor in the operation model 101. Then, a decode section inferring process 202 analyzes the DFG 103 to infer a decode section which performs a decode operation of a HW instruction of the processor in the operation model 101. Next, an instruction code constitution inferring process 203 analyzes the DFG 103 to infer a constitution of a bit string of the processor instruction in the operation model 101. Further, a template output process 204 generates the architecture template 109 based on the DFG 103 and hardware information 107.

Figure 3:
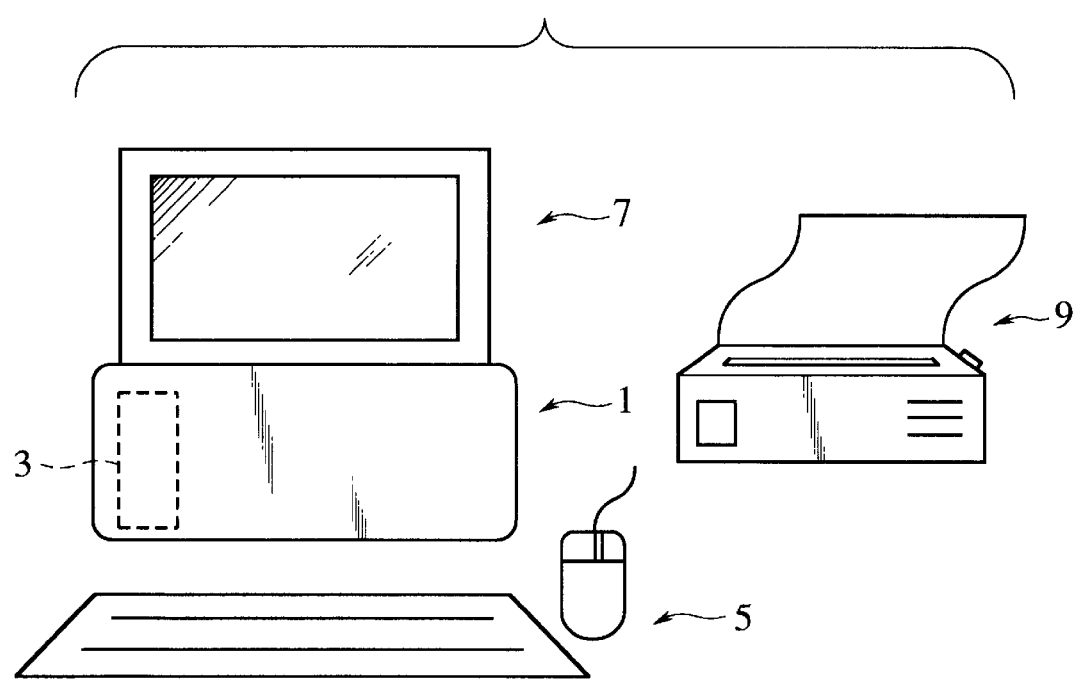
FIG. 3 is a constitutional diagram of a logical circuit automatic design system.

Referring to FIGS. 3 and 4, the architecture template automatically generated by the present invention is utilized in the following logical circuit automatic design system. Hereinafter, this logical circuit automatic design system is described in the relationship with a conventional system. FIG. 3 is a constitutional diagram of the logical circuit automatic design system, and FIG. 4 is a design flow in the case where a special purpose processor is designed by selecting the architecture template according to the present invention.

This system is composed of a computer 1, storage means 3 such as a disk unit, input means 5 such as a mouse and a keyboard, and output means such as a monitor 7 and a printer 9. Moreover, a program for the logical circuit automatic design system according to the present invention is previously installed in this system. This program can be stored in a floppy disk, CD-ROM, etc.

First, when a signal processing algorithm 301 is inputted, an input process 302, static analyzing process 303, dynamic analyzing process 304 and feature extracting process 305 are performed so that software information 306 and template selection information 307 are generated. The template selection information 307 includes information such as the number of loops included in the signal processing algorithm, the number of steps of the respective loops, the number of variables to be used, parallelism of instructions, possibility of composing instructions, sizes of necessary ROM and RAM, and the number of I/O ports. In a template selecting process 309, a designer selects an optimal architecture template using a mouse or the like from plural architecture templates stored in a template library 308 on reference to the template selection information 307 and high-level synthesizing condition included in the architecture templates, input port declaration, output port declaration, register declaration, register file declaration, ROM declaration, RAM declaration, ALU declaration and HW declaration displayed on the monitor 7. Here, the high-level synthesizing condition, input port declaration, output port declaration, register declaration, register file declaration, ROM declaration, RAM declaration, ALU declaration and HW declaration are mentioned later. A template setting process 310 suitably set parameters of a special purpose processor in the selected architecture template based on the software information 306 to generate hardware description 313 of the special purpose processor. Further, a software 312 for executing the signal processing algorithm 301 on the special purpose processor is obtained by a machine instruction string generating process 311 based on the architecture template in which the parameter was set and software information 306. In this design flow, the template library 308 and template selecting process 309 are important elements which are introduced as improvement.

The following describes a concrete operation for synthesizing architecture templates in the embodiment of the present invention with reference to FIGS. 5 through 15.

First, the DFG creating process 102 is performed by using the operation model 401 shown in FIG. 5 as an input. In the operation model 401, it is defined that, on lines 1 through 4, ADD corresponds to 1, LOAD to 2, STORE to 3 and JUMP to 4. On line 5 iport is defined as an integer input port array, on line 6 oport as an integer output port array, on line 7 pc as an integer register, on line 8 data as an integer register, on line 9 regfile as an integer register file (register arrangement), on line 10 prg as an integer ROM, and on line 11 mem as an integer RAM. On lines 12–39, respective case statements in switch statement defines machine instructions (HW instructions) of the processor. On line 14, an integer variables for work are defined. On line 15, data are read from a port No. 0 of the input port iport and are substituted into register data. On line 16, contents in an address indicated by register pc are read from ROM prg and are substituted into the work variable inst. On line 17, inst is shifted right by 24 bits, and the shifted inst is subjected to AND operation bit by bit with hexadecimal number 0xff, and then the result is substituted into the work variable op. On line 18, it is represented that branch occurs according to a value of op. Lines 19–24 shows an operation of the processor in the case that the value of the work variable op is ADD. On line 20, inst is shifted right by 16 bits, and the shifted inst is subjected to AND operation bit by bit with hexadecimal number 0xff, and then the result is substituted into the work variable f1. On line 21, inst is shifted right by 8 bits, and the shifted inst is subjected to AND operation bit by bit with hexadecimal number 0xff, and the result is substituted into the work variable f2. On line 22, bit AND operation of inst and hexadecimal number 0xff is carried out, and the result is substituted into the work variable f3. On line 23, the content of regfile in address f1 and the content of regfile in address f2 are added and the added value are written to regfile in address f3. Lines 25–29 shows an operation of the processor in the case that the value of the work variable op is LOAD, and the content of mem in address f2 is read into regfile in address f1. Lines 30–34 shows an operation of the processor in the case that the value of the work variable op is STORE, and the content of regfile in address f2 is written into mem in address f1. Lines 35–38 shows an operation of the processor in the case that the value of the work variable op is JUMP, and the value of f1 is substituted into pc. On line 40, the value of data is outputted into the port No. 0 of the output port oport.

Figure 6A:
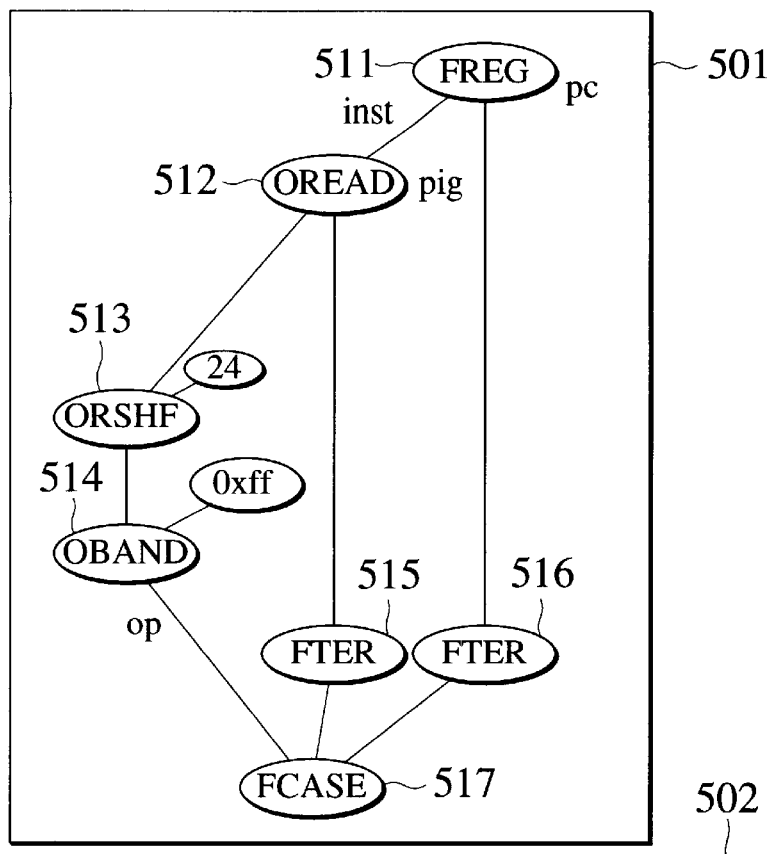
FIGS. 6A and 6B are drawings showing a portion of DFG generated by a DFG generating process.
Figure 6B:
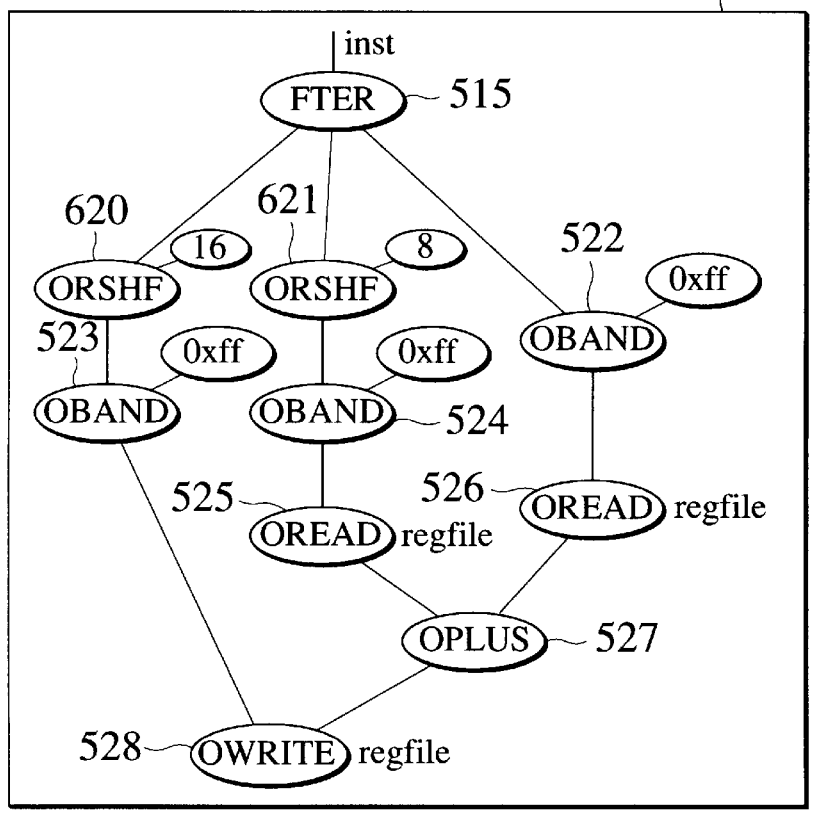

A portion of the DFG 103, which is generated by the DFG creating process 102 when the operation model 401 is inputted, is shown in 501 And 502 of FIGS. 6A and 6B. DFG is generated for each block of the operation model 101. In this embodiment of the present invention, a top level of the operation model 101, and respective case statements in switch statement become blocks. DFG 501 corresponds to lines 16–18 of the operation model 401. DFG 502 corresponds to lines 19–25 of the operation model 401. In the DFGs 501 and 502, FREG represents register, ORSHF represents right shift, OBAND represents bit AND operation, FTER represents a flow of data over DFG, OPLUS represents addition, OREAD represents reading of data from input port array, output port array, register file, RAM or ROM, and OWRITE represents writing into input port array, output port array, register file or RAM.

Next, the scheduling process 104 and allocation process 106 are performed. In the processes 104 and 106, a technique described in "Search Space Reduction in High level Synthesis by Use of an Initial Circuit" (A. Masuda, H. Imai, J. P. Hansen, M. Sekine; proc. of ASP-DAC'95, pp. 471–477, 1995) is used. This technique is characterized by performing the allocation process 106 based on an initial circuit. The scheduling process 104 generates the scheduling information 105 which is a correspondence table of respective nodes of the DFG 103 and execution time thereof. The allocation process 106 generates a correspondence table of the respective nodes of the DFG 103 and arithmetic sections for executing the respective nodes and a correspondence table of edges between the nodes of the DFG 103 and connection between the arithmetic sections as the hardware information 107.

Then, the architecture template generating process 108 is performed. In the process 108, the program counter inferring process 201, decode section inferring process 202, instruction code constitution inferring process 203 and template output process 204 are performed. In the program counter inferring process 201, a variable used for specifying ROM address out of variables register-declared in the operation model 101 is inferred as a program counter. In the decode section inferring process 202, DFG 103 corresponding to HW instruction of the processor described in the operation model 101 is broken into a section where a binary code of instruction is decoded and the other HW instruction executing section. This is because when ALU declaration described below is outputted, only information about the HW instruction executing section should be outputted. In the instruction code constitution inferring process 203, an order of arguments of the HW instructions is inferred.

The order of arguments of the HW instructions is used in the machine instruction string generating process 311. In the template output process 204, the information selected in the processes 201, 202 and 203 and the architecture template are outputted into a file.

The program counter inferring process 201 is performed according to the following procedure.

(P1) Retrieve DFG 103 corresponding to the top level of the operation model 101 and find all OREAD nodes.

(P2) Go upstream, along the direction of the DFG, on the input side of an OREAD node out of the found OREAD nodes which performs reading from ROM.

(P3) Regard a variable as a program counter when the FREG node corresponding to the variable being register-declared in the operation model 101 is found.

In FIG. 6A, since DFG corresponding to the top level of the operation model 401 is DFG 501, OREAD 512 is found by step(P1). Since 512 is reading from ROM prg, it goes upstream by one according to step(P2). Since FREG 511 on the upper stream of 512 corresponds to a variable pc being register-declared in the operation model 401, it is inferred as a program counter of the operation model 401 of the variable pc by step(P3).

Figure 7:
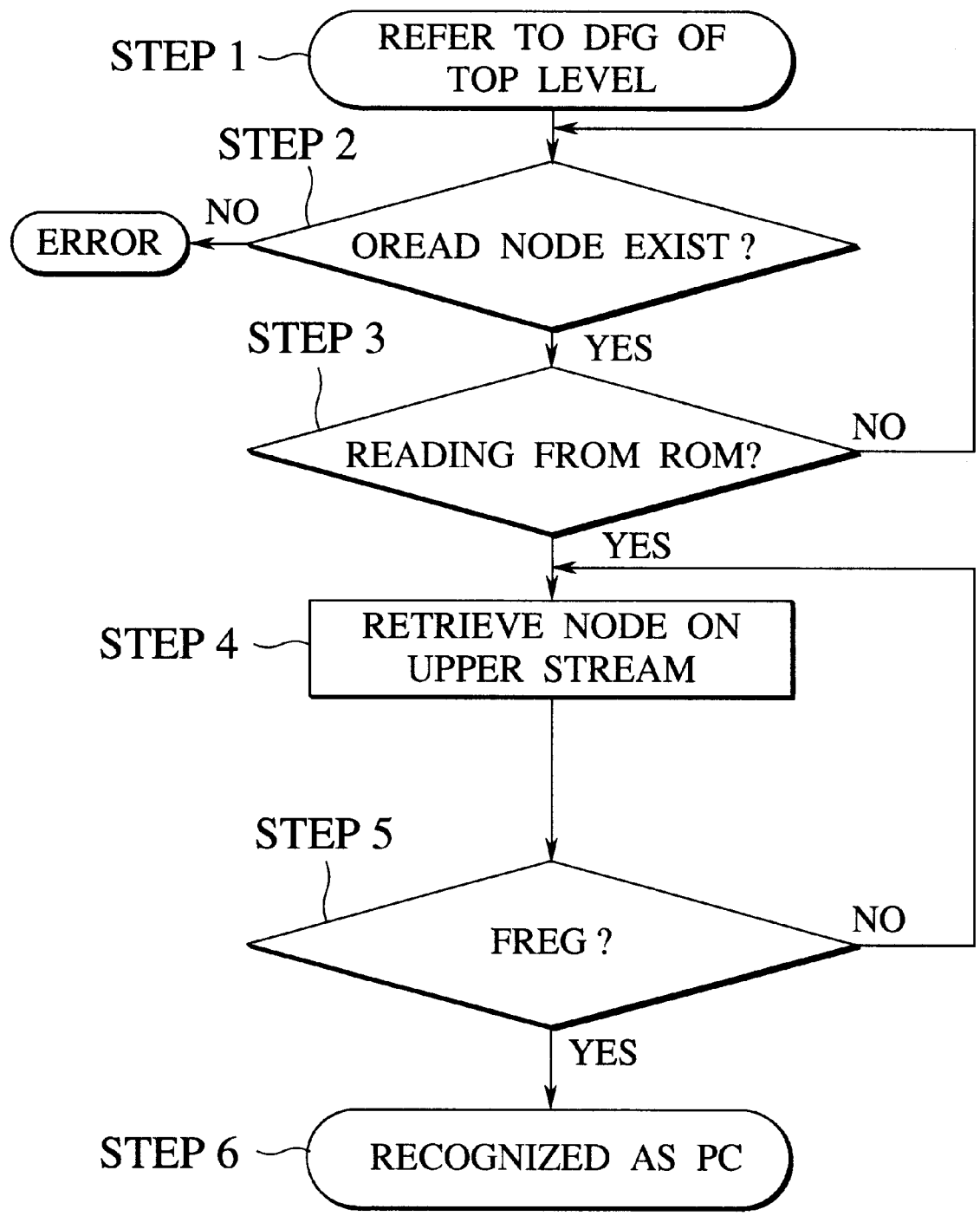
FIG. 7 is a flow chart of a program counter inferring process.

In other words, as shown in the flowchart of FIG. 7, at step 1, the DFG 103 corresponding to the top level of the operation model 101 is referred to. At step 2, an OREAD node existing in the DFG 103 is retrieved, and at step 3 a check is made as to whether or not the OREAD node performs reading from the ROM. If the node does not perform reading from the ROM, the sequence returns to step 2 so that a next OREAD node is retrieved, and at step 3 the check is made again as to whether or not the OREAD node performs reading from the ROM. Step 2 is repeated until OREAD node which performs reading from the ROM is found at step 3, or until the retrieval of all the OREAD nodes existing in the DFG 103 is completed. If no OREAD node existing in the DFG 103 performs reading from the ROM, error is outputted.

When OREAD node which performs reading from the ROM is found at step 3, FREG node corresponding to a variable being register-declared on the input side of the OREAD node is specified at steps 4 and 5, and this variable is inferred and regarded as the program counter (step 6).

The decode section inferring process 202 is performed according to the following procedure.

(D1) Retrieve DFG 103 corresponding to the top level of the operation model 101 and find OREAD node which performs reading from the ROM.

(D2) Go downstream from the found OREAD node, add a decode section mark (mark representing the decode section) to shift operation by a constant numbers of bits (right shift and left shift) and bit operation with a constant value (bit OR and bit AND), and go downstream further to continue decode section inference.

(D3) Add the decode section mark to FTER node and continue the decode section inference for lower DFG.

(D4) In the case of reaching a node other than the above ones, stop the decode section inferring process at that node.

(D5) In DFG, name a section other than the decode section as an instruction executing section.

Figure 8A:
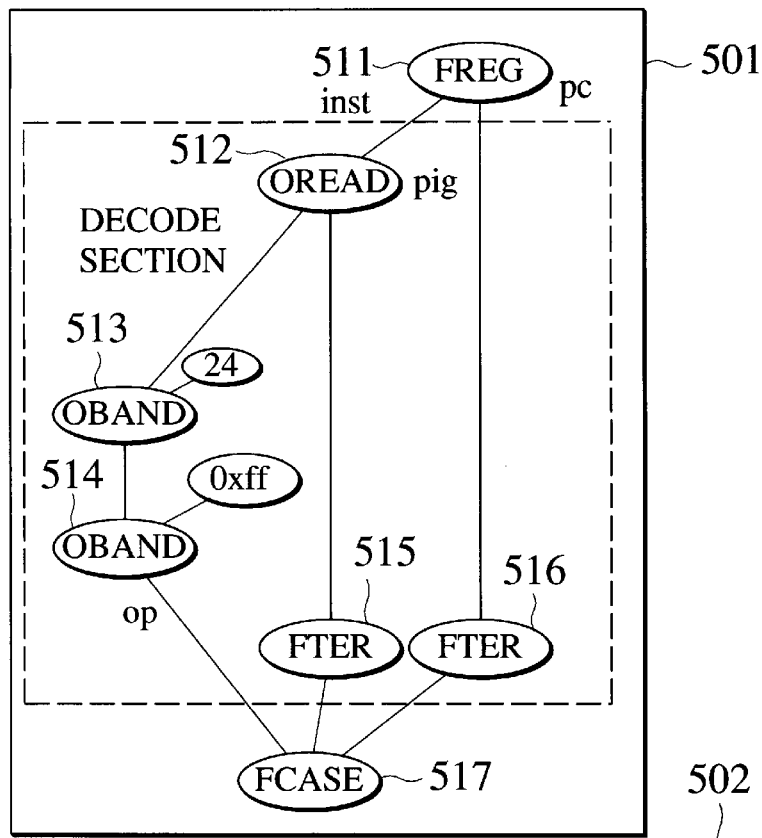
FIGS. 8A and 8B are drawings showing a portion of DFG specified by a decode section.
Figure 8B:
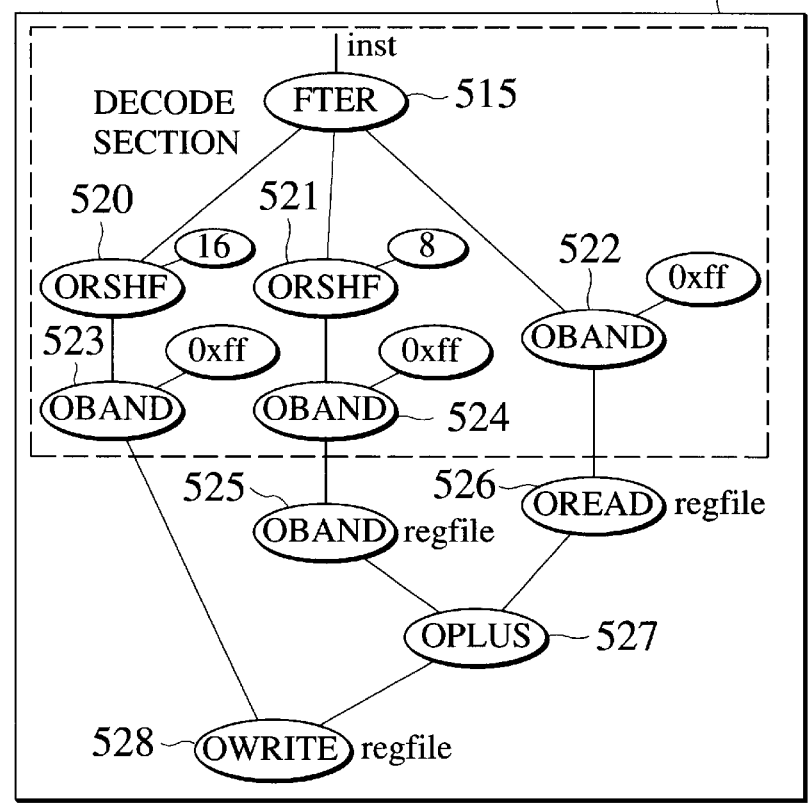

Since DFG corresponding to the top level of the operation model 401 is DFG 501, in FIG. 8A, OREAD 512 is found by step(D1). The decode section inferring process is performed towards the lower stream from 512. The decode section mark is added to ORSHF 513 and OBAND 514 by step(D2). The decode section mark is added to the FTER 515 and FTER 516 by step(D3), and the decode section inferring process is performed for lower DFG. Since the lower DFG of the FTER 515 is DFG 502, in the DFG 502 of FIG. 8B, the decode section mark is added to 520, 521, 522, 523 and 524 by step(D2). According to the above processes, DFG nodes within a broken line of FIGS. 8A and 8B are inferred and regarded as the decode section.

Figure 9:
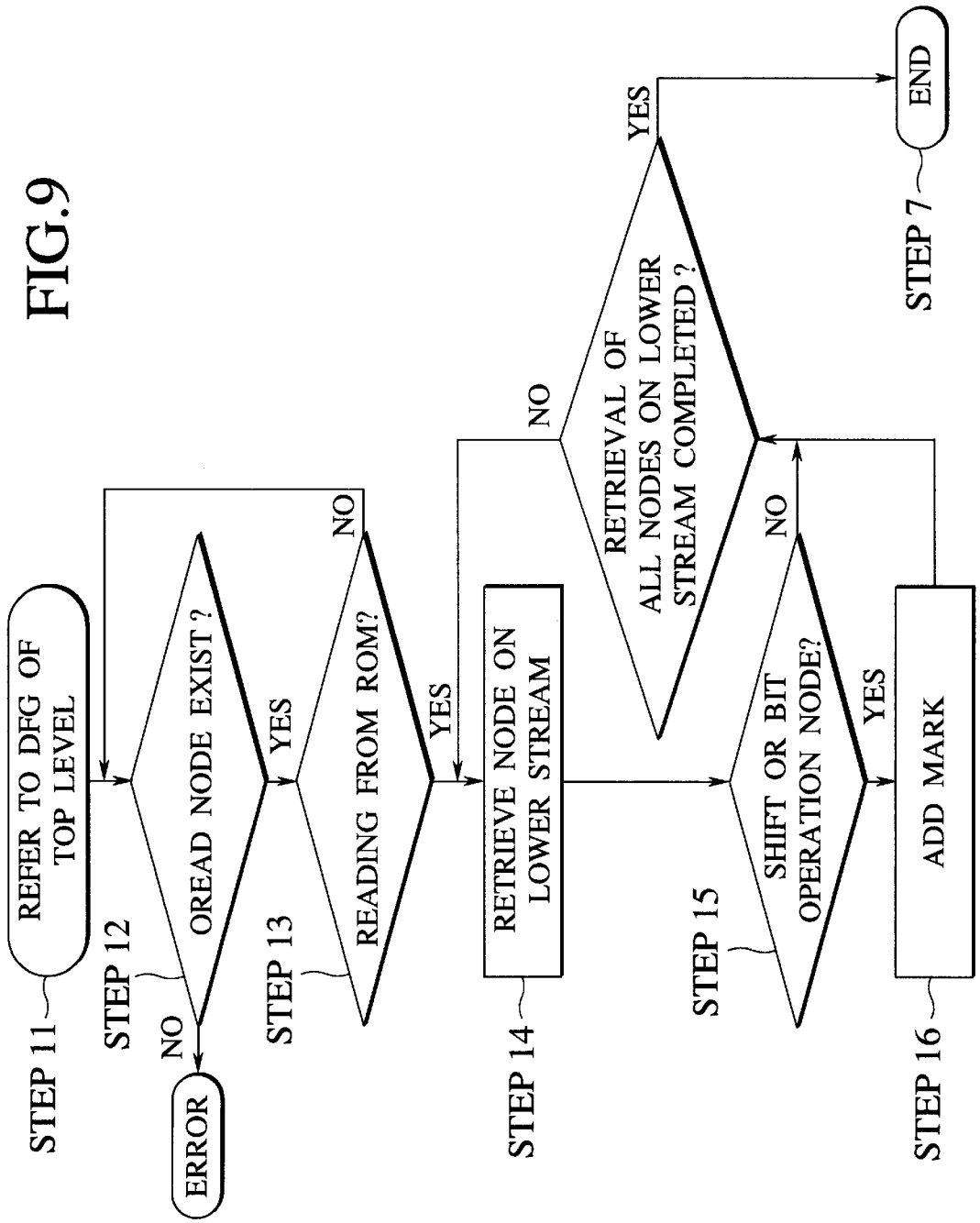
FIG. 9 is a flow chart of a decode section inferring process.

In other words, as shown in the flow chart of FIG. 9, at step 11, DFG 103 corresponding to the top level of the operation model 101 is referred to. An OREAD node existing in the DFG 103 is retrieved at step 12, a check is made at step 13 as to whether or not this OREAD node performs reading from the ROM. If the node does not perform reading from the ROM, the sequence returns to step 12 so that a next OREAD node is retrieved, and a check is made again at step 13 as to whether or not the OREAD node performs reading from ROM. Step 12 is repeated until an OREAD node which performs reading from the ROM is found at step 13, or until the retrieval of all the OREAD nodes existing in the DFG 103 is completed. When no the OREAD node existing in the DFG 103 performs reading from the ROM, error is outputted.

When an OREAD node which performs reading from the ROM is found at step 13, a node on the output side of the OREAD node is retrieved at step 14, a check is made at step 15 as to whether this node corresponds to the shift operation (right shift and left shift) by a constant number of bits or the bit operation (bit OR and bit AND) with a constant value, and when this node corresponds to one of them, the decode section mark is added to this node at step 16. The processes at steps 15 and 16 are performed on all the nodes on the output side of the OREAD node.

The instruction code constitution inferring process 203 is performed according to the following procedure.

(C1) Prepare an array T of a length 32, of which respective elements are addresses of arrays.

(C2) Retrieve DFG 103 corresponding to the top level of the operation model 101 and find OREAD node which performs reading from the ROM.

(C3) Propagate the array T towards the lower stream from the found OREAD node.

(C4) In the case where the array T passes the shift operation (right shift and left shift) by a constant number of bits, shift the element of the array T right or left by a constant number of bits, and substitute 0 into dead array elements.

(C5) In the case where the array T passes the bit operation (bit OR and bit AND) with a constant value, deal the array T in the same manner as a bit string, subject the array T to an operation of bit OR or bit AND with a constant value, and substitute its result into the array T.

(C6) Continue an instruction system inferring process for lower DFG by FTER node.

(C7) Stop the propagation of the array T at the time when going out of the decode section.

(C8) Name the contents of the respective arrays T after the completion of propagation as a1, a2, a3, . . . , aN in order of having larger value at the boundary between the decode section and the instruction executing section. They are called instruction arguments.

Figure 11:
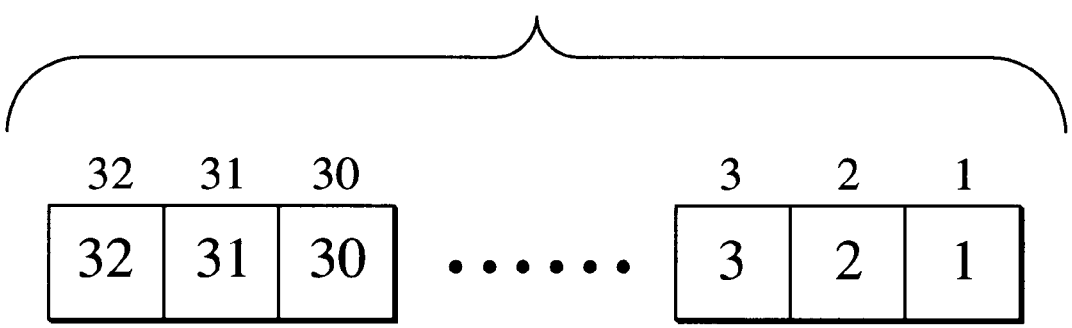
FIG. 11 is a drawing for explaining the instruction code constitution inferring process.
Figure 12:
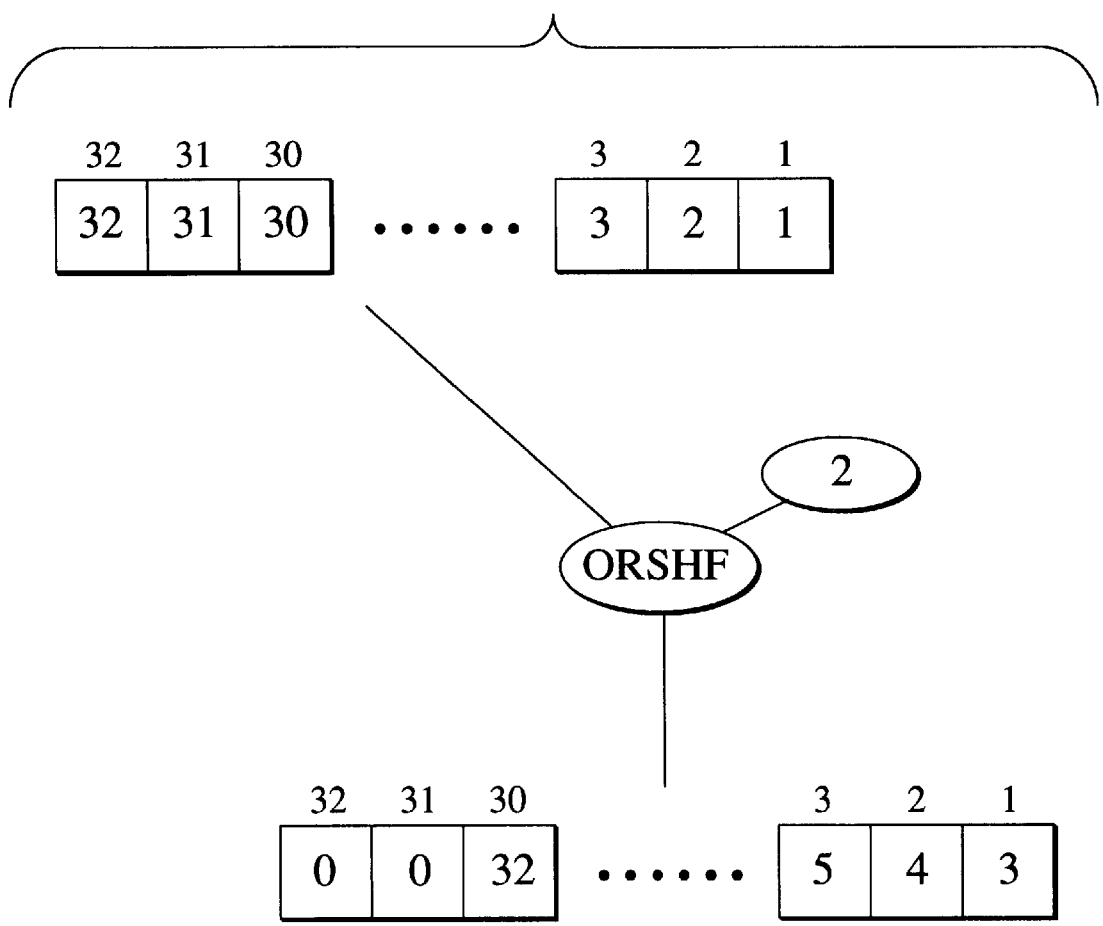
FIG. 12 is a drawing for explaining the instruction code constitution inferring process.
Figure 13:
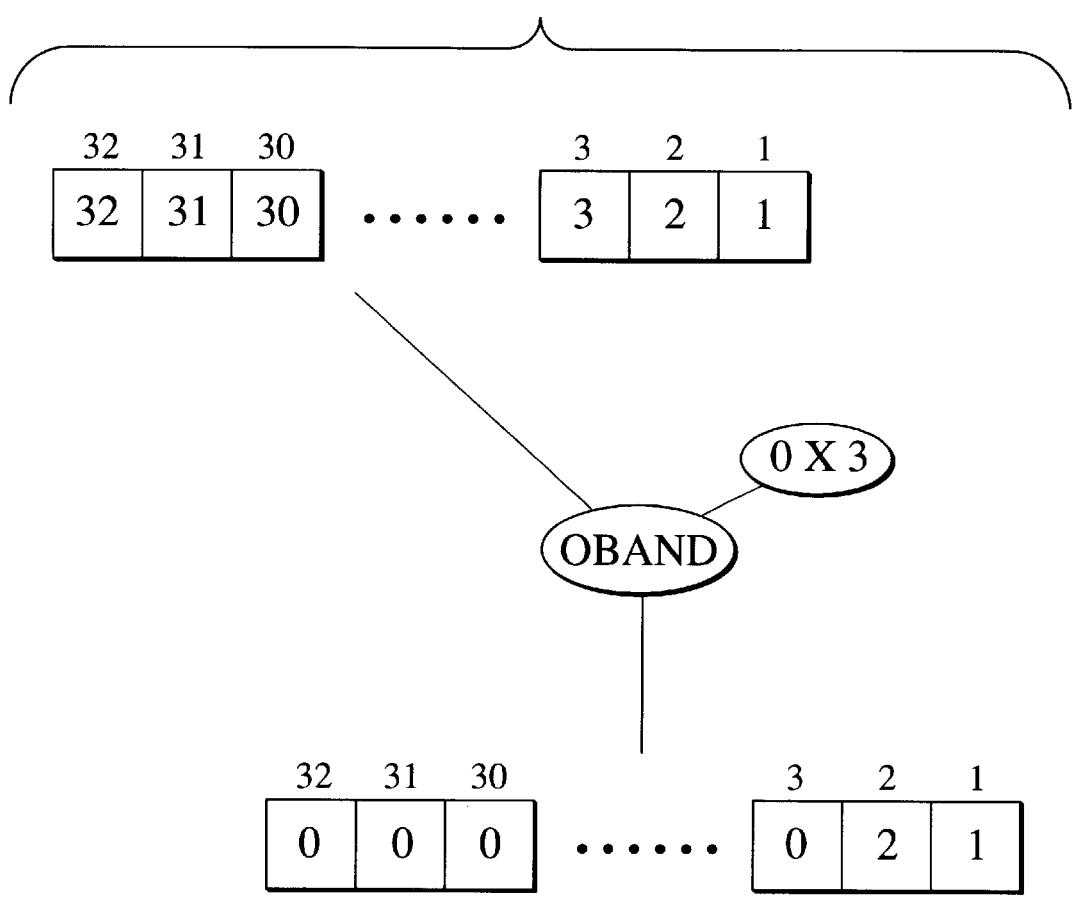
FIG. 13 is a drawing for explaining the instruction code constitution inferring process.

The initial state of the array T is as shown in FIG. 11. When the array T in the initial state is allowed to pass ORSHF for right shift by 2 bits, as shown in FIG. 12, the elements of the array T are shifted right by two and 0 is substituted into the two elements on the left end side. When the array T in the initial state is allowed to pass OBAND for subjecting it to bit AND with constant value hexadecimal 0x3, as shown in FIG. 13, 0 is substituted into the elements other than first and second ones.

When the instruction code constitution inferring process 203 is performed on DFG of FIG. 6B, as for the values of the array T on the output sides of 523, 524 and 522, 24 to 17 are substituted into the eighth to first elements and 0 into the other elements, 16 to 9 are substituted into the eighth to first elements and 0 into the other elements, and 8 to 1 are substituted into the eighth to first elements and 0 into the other elements, respectively. According to step(C8), the outputs sides of 523, 524 and 522 are named a1, a2 and a3 respectively, and they are set as instruction arguments.

Figure 10:
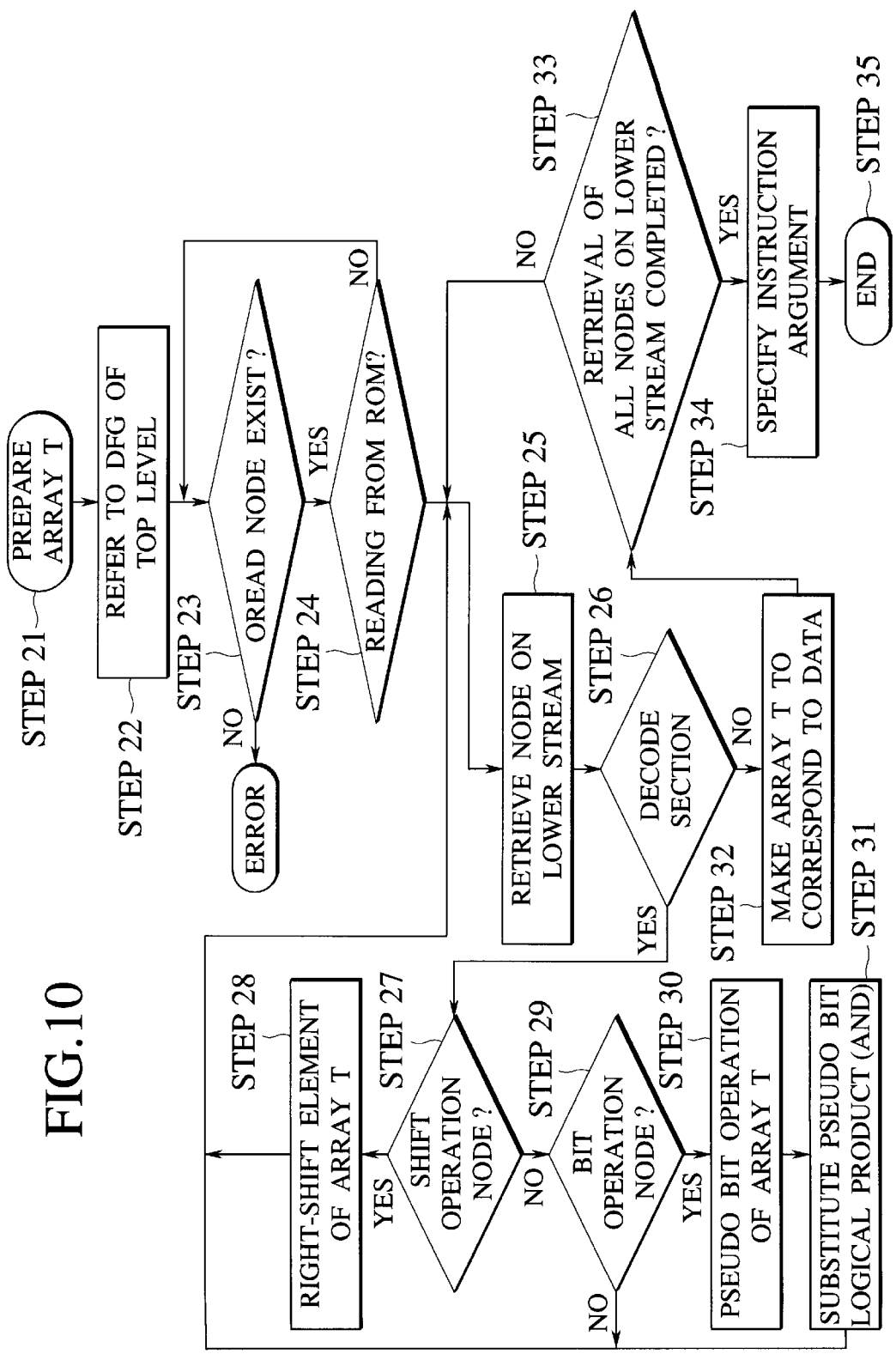
FIG. 10 is a flow chart of an instruction code constitution inferring process.

In other words, as shown in the flow chart of FIG. 10, the array T having 32 integer data is prepared at step 21. Initial values shown in FIG. 11 are given to the elements of the array. The DFG 103 corresponding to the top level of the operation model 101 is referred to at step 22. OREAD node existing in the DFG 103 is retrieved at step 23. If no OREAD node exists, error is outputted and the process is ended. A check is made at step 24 as to whether or not the OREAD node performs reading from the ROM. If the OREAD node does not perform reading from the ROM, the sequence returns to step so that next OREAD node is retrieved, and a check is made again at step 24 as to whether or not the OREAD node performs reading from the ROM. If no OREAD node performs reading from the ROM, error is outputted and the process is ended.

When OREAD node which performs reading from the ROM is found at step 24, a node connected to the output side of OREAD node (namely, node in the lower stream) is retrieved at step 25. A check is made at step 26 as to whether or not the node belongs to the decode section. Since plural data generally stream from the OREAD node which performs reading from the ROM, as to one stream, a node in lower stream is retrieved and the following process is performed, and when going out of the decode section, as to the next stream, a node in lower stream is retrieved in the same manner.

When the node belongs to the decode section, a check is made at step 27 as to whether or not the node corresponds to the shift operation (right shift and left shift) by a constant number of bits. If the node is the shift operation, the element of the array T is shifted right or left by the constant number of bits at step 28, and 0 is substituted into the dead elements of the array. If the node is not shift operation at step 27, a check is made at step 29 as to whether or not the node corresponds to the bit operation (bit OR and bit AND) with a constant value. If the node is the bit operation, at step 30 the array T is dealt just like the bit string so that the operation of the bit OR or bit AND with a constant value is performed, and the result is substituted into the array T at step 31. Namely, in this pseudo bit AND operation, if the value of the element of the array T is not 0, it is regarded as "1", and if the value is 0, it is regarded as "0". Then, the bit AND is performed, and if the result is "1", corresponding integer value is maintained, and if the result is "0", 0 is substituted into the corresponding integer value.

After step 28 or 31, or in the case where the node is not the bit operation at step 29, the sequence returns to step 25 so that a check is made as to whether or not the node belongs to the decode section. If the node belongs to the decode section, the same steps from 27 are repeated. If the node does not belong to the decode section, the array T at this time is made to correspond with the data. Then, if the retrieval for all the streams is not ended at step 33, as for another stream, a node in lower stream is retrieved. In this case, an array T which was initialized newly is prepared.

Here, FTER node continues the instruction system inferring process for lower DFG. If the retrieval for all the streams is ended, the respective contents of the arrays T are named a1, a2, a3, . . . , aN in order of having larger values, and instruction arguments are specified.

In the template output process 204, higher-level synthesizing condition, input port declaration, output port declaration, register declaration, register file declaration, ROM declaration, RAM declaration ALU declaration, and HW declaration are outputted. As the higher-level synthesizing conditions, information such as a file name of the operation model which is a source of the architecture template, a file name of an initial circuit used for the allocation process 106, a retrieval parameter value at the time of higher-level synthesis and clock cycle is outputted. As the input port declaration, a variable specified as input port in the operation model 101 is outputted in the form of "input type, variable name [the number of ports];". As the output port declaration, a variable specified as output port in the operation model 101 is outputted in the form of "output type, variable name [the number of ports];". As the register declaration, a variable specified as register in the operation model 101 is outputted in the form of "register type, variable name;". As the register file declaration, a variable specified as register file in the operation model 101 is outputted in the form of "register type, variable name [ ];". As the ROM declaration, a variable specified as ROM in the operation model 101 is outputted in the form of "rom type, variable name [ ];". As the RAM declaration, a variable specified as RAM in the operation model 101 is outputted in the form of "ram type, variable name [ ];". In DFG corresponding to HW instruction definition (each case statement in switch statement) of the operation model 101, the ALU declaration is outputted in the form of "instruction name: instruction argument 1: instruction argument 2: . . . , instruction argument N {operation expression 1; operation expression 2; . . . operation expression M;}" per portion to which the decode section mark is not added by the decode section inferring process 202, that is, per instruction executing section. The operation expressions are outputted according to the following table 1.

TABLE 1

| Type of DFG Node | Output Form |
| --- | --- |
| monadic operation | operation name, operation argument |
| binomial operation | operation argument 1, operation name, operation argument 2 |
| writing to program counter | JUMP, jump address |

In addition, the operation arguments and jump addresses are outputted according to the following Table 2.

TABLE 2

| Type of DFG Node | Operation Form |
| --- | --- |
| reading and writing of register | R (type, register name) |
| reading and writing of register file | R (type, register file name, index) |
| reading and writing of I/O port | P (type, port name, index) |
| reading from ROM | M (type, ROM name, index) |
| reading and writing in RAM | M (type, RAM name, index) |
| constant | I (type, numerical value) |

The higher-level synthesizing conditions, input port declaration, output port declaration, register declaration, register file declaration, ROM declaration, RAM declaration and ALU declaration shown in FIG. 14 are outputted from the operation model 401.

As the HW declaration, hardware description of a register transmit level which was described in hardware description language is outputted from the hardware information 107. Here, at the time of generating architecture template, since bit width and size shown in the following Table 3 are undetermined, they should be parametrized. These parameters are determined by the template setting process 310.

TABLE 3

PARAMETERS OF ARCHITECTURE TEMPLATE

Bit width of int type
Bit width of float type
Bit width of point section of float type
Bit width of characteristic section of float type
Bit width of input port
Bit width of output port
Bit width of register
Bit width of RAM
Bit width of ROM/HW instruction
Bit width of operation code section of HW instruction
Bit width of register specification of HW instruction
Bit with of I/O ports specification of HW instruction
Bit width of RAM address specification of HW instruction
Bit width of constant value of HW instruction
The number of words in ROM
The number of words in RAM
The number of input ports
The number of output ports
The number of registers in register file Macros shown in the following Table 4 are put into the hardware description, and at the time when concrete values of the parameters are determined in the setting process 310, they are replaced by the concrete hardware description.

TABLE 4

| MACRO | EXPLANATION |
| --- | --- |
| TYPE (<type string>) | Replaced by type name |
| BITW (<type string>) | Replaced by a numerical value of the maximum bit width |
| SIZE_ROM | Replaced by word width of ROM |
| SIZE_RAM | Replaced by the number of words of RAM |
| SIZE_INPORT | Replaced by the number of input ports |
| SIZE_OUTPORT | Replaced by the number of output ports |
| SIZE_REGFILE | Replaced by the number of registers of register file |
| CONST (<bit width>, (constant>) | Substitute <constant> into binary number of <bit width> |
| ASSIGN (<signal name of substitution destination>, <bit width of substitution destination> <signal name of substitution destination> <bit width of substitution source>) | When the bit widths of substitution source and substitution destination are different, adjust and replace the bit widths so that signal substitution is performed. |
| USE (<HW instruction name>), END | When <HW instruction> is not necessary, delete description from USE to END. |

As for <Type string>, the types shown in the following Table 5 are made to correspond with each bit of the bit string that overlapping of types is represented by a string of 0 and 1.

TABLE 5

| BIT POSITION | TYPE |
| --- | --- |
| 1 | Bit width of int type/int type |
| 2 | Bit width of float type/float type |
| 3 | Bit width of fraction of float type |
| 4 | Bit width of characteristic of float type |
| 5 | Bit width of input port |
| 6 | Bit width of output port |
| 7 | Bit width of register |
| 8 | Bit width of RAM |
| 9 | Bit width of ROM/HW instruction |
| 10 | Bit width of operation code section of HW instruction |
| 11 | Bit width of register specification of HW instruction |
| 12 | Bit width of I/O port specification of HW instruction |
| 13 | Bit width of RAM address specification of HW instruction |
| 14 | Bit width of constant value of HW instruction |
| 15 | The number of words in ROM |
| 16 | The number of words in RAM |
| 17 | The number of input ports |
| 18 | The number of output ports |
| 19 | The number of registers in register file |

For example, the type of the bit width of int type or bit width of register is represented by "0000000000001000001".

A portion of the HW declaration generated by the operation model 401 is shown in FIG. 15.

According to the present invention, because the architecture template of a special purpose processor which is suitable for an objective signal processing algorithm is selected, a special purpose processor can be synthesized the most suitably for any signal algorithm.

Moreover, according to the present invention, since the architecture template of a special purpose processor can be synthesized automatically from a operation model, in the case where a desirable architecture template does not exist, architecture template can be synthesized for a short time. As a result, a special purpose processor which is the most suitable for various signal processing algorithms can be obtained.

Further, according to the present invention, when integer type, floating-point type, input port type, output port type, register type, RAM type and ROM type are specified as a data type for the operation mode, there arise an effect such that a operation model can be described easily and an effect such that description of a operation model is easily understood.

Further, according to the present invention, since parameters of the processor can be inferred automatically from a operation model, there arises an effect such that a operation model can be described more simply.

Further, according to the present invention, since the structure of the architecture template becomes clear, the analysis of the architecture template becomes easy.

Further, according to the present invention, since the parameters of architecture template are defined, the parameter setting process can be performed by a simple process of replacing character strings.

It should be understood that many modifications and adaptations of the invention will become apparent to those skilled in the art and it is intended to encompass such obvious modifications and changes in the scope of the claims appended hereto.

What is claimed is:

1. A logical circuit automatic design system for automatically synthesizing a special purpose processor which is optimized to perform a necessary signal processing algorithm, the system comprising:

storage means for storing plural architecture templates of a processor;

template selecting information generating means for generating template selecting information based on said necessary signal processing algorithm;

output means for outputting at least one architecture template of a processor;

second input means for selecting, based on said template selecting information, one of said at least one architecture template outputted by said output means; and synthesizing means for automatically synthesizing the special purpose processor which is optimized to perform said necessary signal processing algorithm using the selected architecture template.

2. A logical circuit automatic design system according to claim 1, wherein said template selecting information generating means performs a static analyzing process, a dynamic analyzing process and a feature extracting process on said necessary signal processing algorithm to generate said template selecting information.

3. A logical circuit automatic design system according to claim 1, further comprising:

second generating means for generating software information based on said necessary signal processing algorithm; and hardware description generating means for setting a parameter for the special purpose processor to said selected architecture template based on said software information to generate hardware description for the special purpose processor.

4. A logical circuit automatic design system according to claim 3, further comprising:

software generating means for generating, based on said selected architecture template to which the parameter is set and said software information, software for executing said necessary signal processing algorithm on said special purpose processor.

5. A logical circuit automatic design system according to claim 1, further comprising:

data flow graph (DFG) generating means for generating DFG from an operation model;

scheduling processing means for determining an execution time of each operation node of the DFG so as to generate scheduling information;

allocating processing means for generating hardware information from the scheduling information;

architecture template generating processing means for generating an architecture template from the hardware information; and architecture template setting means for setting the architecture template in said storage means.

6. A logical circuit automatically designing method of automatically synthesizing a special purpose processor which is optimized to perform a necessary signal processing algorithm, the method comprising the steps of:

generating plural architecture templates based on an operational model;

storing said plural architecture templates into a storage unit;

inputting said necessary signal processing algorithm:

generating template selecting information based on said necessary signal processing algorithm;

outputting at least one architecture template of a processor;

selecting, based on said template selecting information, one of said at least one architecture template; and automatically synthesizing a special purpose processor which is optimized to perform the necessary signal processing algorithm using the selected architecture template.

7. A logical circuit automatically designing method according to claim 6, wherein said template selecting information is generated by performing a static analyzing process, a dynamic analyzing process and a feature extracting process on said necessary signal processing algorithm.

8. A logical circuit automatically designing method according to claim 6, further comprising the steps of:

generating software information based on said necessary signal processing algorithm; and setting a parameter for the special purpose processor to said selected architecture template based on said software information to generate hardware description for the special purpose processor.

9. A logical circuit automatically designing method according to claim 8, further comprising the steps of:

generating, based on said selected architecture template to which the parameter is set and said software information, software for executing said necessary signal processing algorithm on the special purpose processor.

10. A logical circuit automatically designing method according to claim 6, said plural architecture templates generating step comprising the steps of:

generating data flow graph (DFG) from the operation model;

determining an execution time of each operation node of the DFG so as to generate scheduling information;

generating hardware information from the scheduling information; and generating an architecture template from the hardware information.

* * * * *